United States Patent
Jen et al.

(10) Patent No.: US 6,287,909 B1
(45) Date of Patent: Sep. 11, 2001

(54) METHOD OF FABRICATING A STATIC RANDOM ACCESS MEMORY

(75) Inventors: Yi-Min Jen, Taipei Hsien; Tse-Yi Lu, Chiayi; Yu-Chih Chuang, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/578,227

(22) Filed: May 24, 2000

(30) Foreign Application Priority Data

Apr. 21, 2000 (TW) .................................................. 89107550

(51) Int. Cl.$^7$ .................... H01L 21/8234; H01L 21/8244

(52) U.S. Cl. ........................................... 438/238; 438/282

(58) Field of Search .................................... 438/238, 262, 438/282, 370, 526, 683, 301–306

(56) References Cited

U.S. PATENT DOCUMENTS 5,998,269 * 12/1999 Huang et al. ......................... 438/282

* cited by examiner

Primary Examiner—David Nelms
Assistant Examiner—Dung A Le
(74) Attorney, Agent, or Firm—Jaiwei Huang; J.C. Patents

(57) ABSTRACT

A method of fabricating a buried contact in a static random access memory. A gate oxide layer, a first conducting layer and a masking layer are formed sequentially on a substrate. A buried contact opening is formed inside the gate oxide layer, the first conducting layer and the masking layer, which opening exposes a part of the substrate. An epitaxial layer is formed inside the buried contact opening, which epitaxial layer fills up the buried contact opening. After the masking layer is removed, a second conducting layer is formed above the substrate. A buried contact is formed in the substrate that is below the epitaxial layer. The gate oxide layer, the first conducting layer, the epitaxial layer and second conducting layer are patterned to expose a part of the substrate and a part of the buried contact. A source/drain is formed in the substrate and a part of the source/drain is mixed with a part of the buried contact.

8 Claims, 5 Drawing Sheets

METHOD OF FABRICATING A STATIC RANDOM ACCESS MEMORY

CROSS-REFERENCE TO RELATED APPLICATION

This application claims the priority benefit of Taiwan application serial no. 89107550, filed Apr. 21, 2000.

BACKGROUND OF THE INVENTION

1. Field of Invention

The present invention relates to a method of fabricating a static random access memory. More particularly, the present invention relates to a method of fabricating a buried contact in a static random access memory.

2. Description of Related Art

Static random access memory (SRAM) is the fastest in the family of semiconductor memory; therefore, SRAM is widely used in many applications, such as cache memory. At present SRAM is commonly applied in digital devices, including minicomputers and microprocessor systems.

The structure of SRAM is divided into memory cells and periphery circuits. The memory cell is used to store information. Periphery circuits contain address decoders that are used to decode the addresses of memory cells, and circuits that are related to memory operation.

The prior art contact structures in SRAM mostly are formed on the source/drains; however, the prior art structures are not suitable for high-integration integrated circuits. Consequently, a buried contact that is compatible with local interconnects is used for high-integration integrated circuits. The buried contact can decrease the application areas of chips; for example, twenty-five percent of the application area is saved when the buried contact is used in SRAM. Therefore, the application of buried contacts is useful for the production of high-density devices.

FIG. 1A to FIG. 1D are schematic, cross-sectional views illustrating process steps of fabricating a buried contact in SRAM according to the prior art.

Referring to FIG. 1A, a substrate 100 is provided. A gate oxide layer 102 and a first polysilicon layer 104 are sequentially formed on the substrate 100. Gate oxide layer 102 and the first polysilicon layer 104 are patterned and defined to form a buried contact opening 105.

Referring to FIG. 1B, a second polysilicon layer 106 is formed over the substrate 100 and fills buried contact opening 105 (FIG. 1A). A buried contact 108 is formed in the substrate 100 exposed by buried contact opening 105.

Referring to FIG. 1C, a photoresist layer 110 is formed on the second polysilicon layer 106. Photoresist layer 110 is used to define gate oxide layer 102, first polysilicon layer 104 and second polysilicon layer 106, thereby to form polysilicon gates. A patterned gate oxide layer 102a, a patterned first polysilicon layer 104a and a patterned second polysilicon layer 106a are formed thereon and a part of the surface of substrate 100 is exposed, in which a source/drain 116 (FIG. 1D) is to be formed. Before defining, buried contact 108 is covered by only one polysilicon layer 106, but the non-buried-contact region in the substrate 100 is covered by two polysilicon layers 104, 106. Moreover, the material of substrate 100 is similar to the material of the second polysilicon layer 106. When a part of the polysilicon layer 106 above buried contact 108 is etched during the definition process for gate oxide layer 102, first polysilicon layer 104 and second polysilicon layer 106, it is easy to over-etch a part of substrate 100 inside the buried contact 108 and form a silicon trench 114 thereon in the buried contact 108. Silicon trench 114 causes current leakage. As silicon trench 114 becomes larger, it cuts through buried contact 108 (as illustrated in FIG. 1C) and causes open circuits between buried contact 108 and source/drain 116 that is to be formed later.

Referring to FIG. 1D, after photoresist layer 110 is removed, source/drain 116 is formed in the substrate 100 when patterned gate oxide layer 102a, patterned first polysilicon layer 104a and patterned second polysilicon layer 106a are used as a mask for ion implantation.

In the prior art, a part of substrate 100 inside buried contact 108 is over-etched to form silicon trench 114 when a part of polysilicon layer 106 is removed because only one polysilicon layer 106 covers buried contact 108. As the depth of silicon trench 114 increases the contact area between source/drain 116 and buried contact 108 in the substrate 100 decreases, which further increases resistivity. If silicon trench 114 is too deep, the current flowing from buried contact 108 through source/drain 116 reorients to be grounded through the substrate 100, which causes junction leakage.

SUMMARY OF THE INVENTION

The invention provides a method of fabricating a buried contact in a SRAM. As embodied and broadly described herein, a substrate is provided and a gate oxide layer, a first conducting layer and a masking layer are formed sequentially on the substrate. A buried contact opening is formed inside the gate oxide layer, the first conducting layer and the masking layer, which opening exposes a part of the substrate. An epitaxial layer is formed inside the buried contact opening, which epitaxial layer fills up the buried contact opening. After the masking layer is removed, a second conducting layer is formed above the substrate. A buried contact is formed in the substrate that is below the epitaxial layer. The gate oxide layer, the first conducting layer, the epitaxial layer and second conducting layer are patterned to expose a part of the substrate and a part of the buried contact. A source/drain is formed in the substrate and a part of the source/drain is mixed with a part of the buried contact, while patterned gate oxide layer, patterned first conducting layer, patterned epitaxial layer and patterned second conducting layer are used as a mask.

The combined thickness of the epitaxial layer and the second conducting layer above the buried contact is the same as the combined thickness of the gate oxide layer, the first conducting layer and the second conducting layer. Because the buried contact is covered by more than one conducting layer, the substrate inside the buried contact is not over-etched to cause silicon trench problems during the definition process for the gate oxide layer, the first conducting layer and the second conducting layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
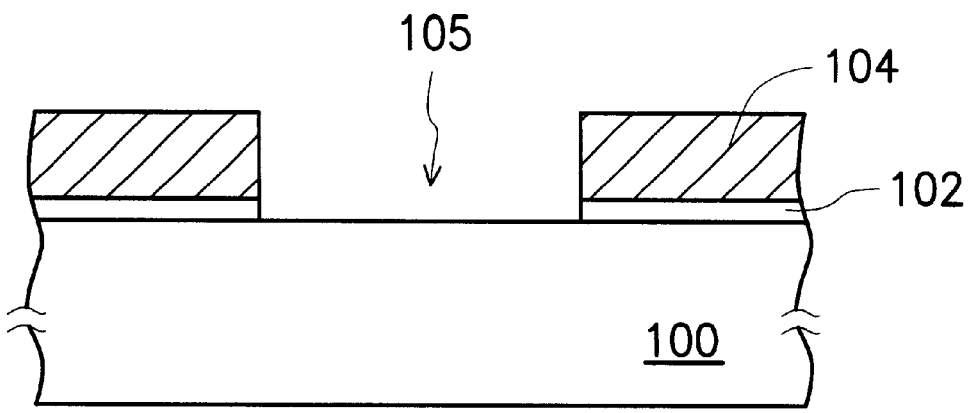
FIG. 1A to 1D are schematic, cross-sectional views illustrating process steps of fabricating a buried contact in SRAM according to the prior art.
Figure 1B:
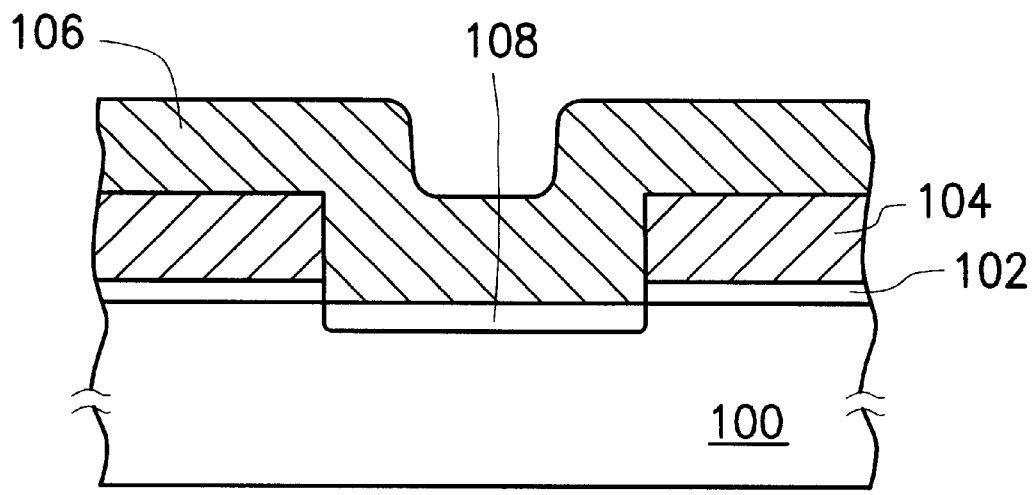
Figure 1C:
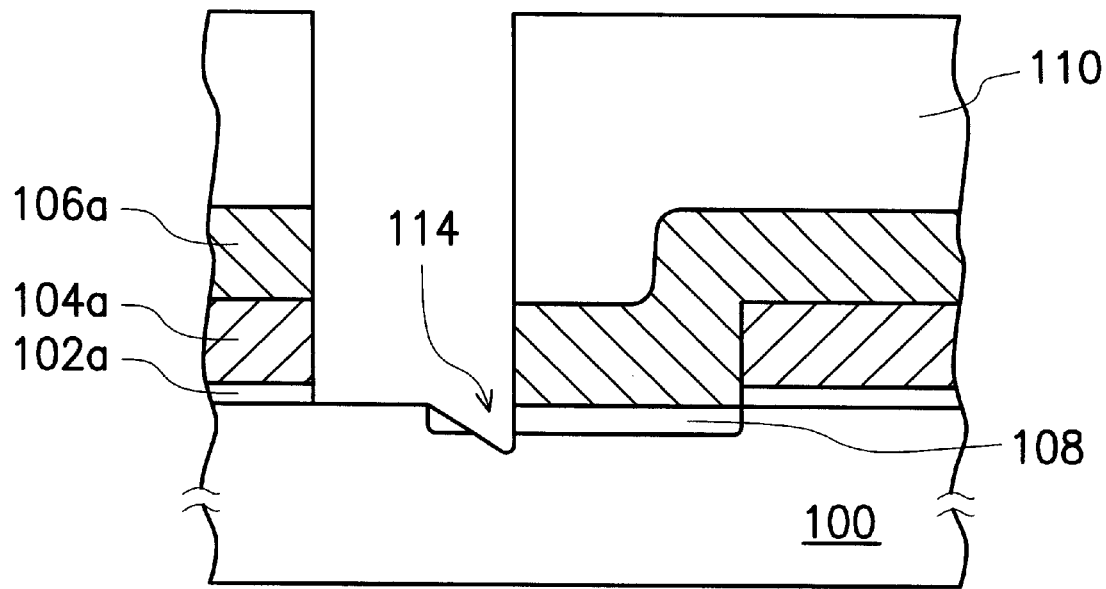
Figure 1D:
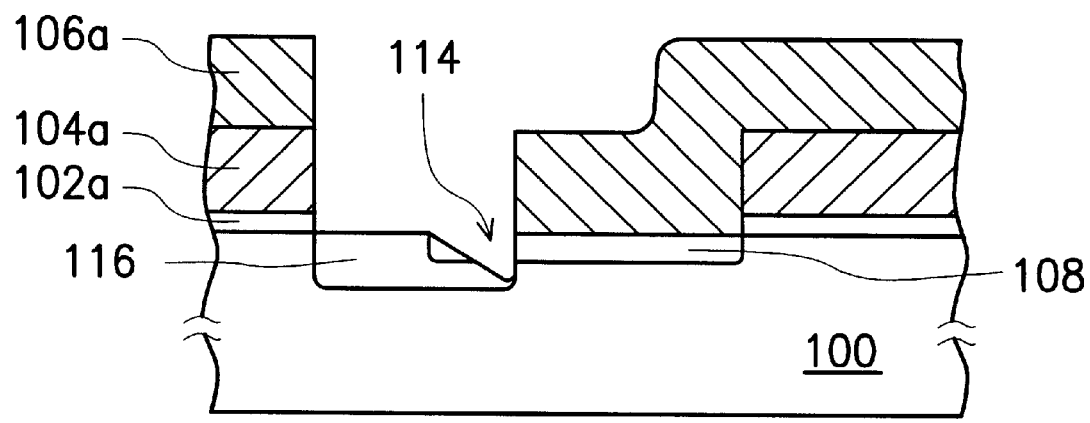
Figure 2A:
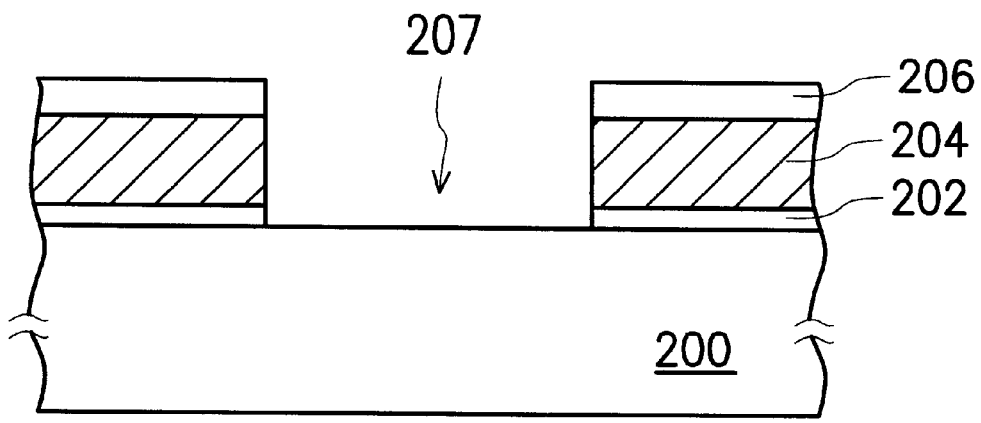
FIG. 2A to FIG. 2E are schematic, cross-sectional views illustrating process steps of fabricating a buried contact in SRAM according to one preferred embodiment of this invention.

Referring to FIG. 2A, a substrate 200 is provided. A gate oxide layer 202, a first conducting layer 204 and a masking layer 206 are formed on the substrate 200. A material for masking layer 206 is, for example, silicon oxide or silicon nitride. Gate oxide layer 202, first conducting layer 204, and masking layer 206 are defined to form a buried contact opening 207 which opening exposes a part of the surface of substrate 200.

Figure 2B:
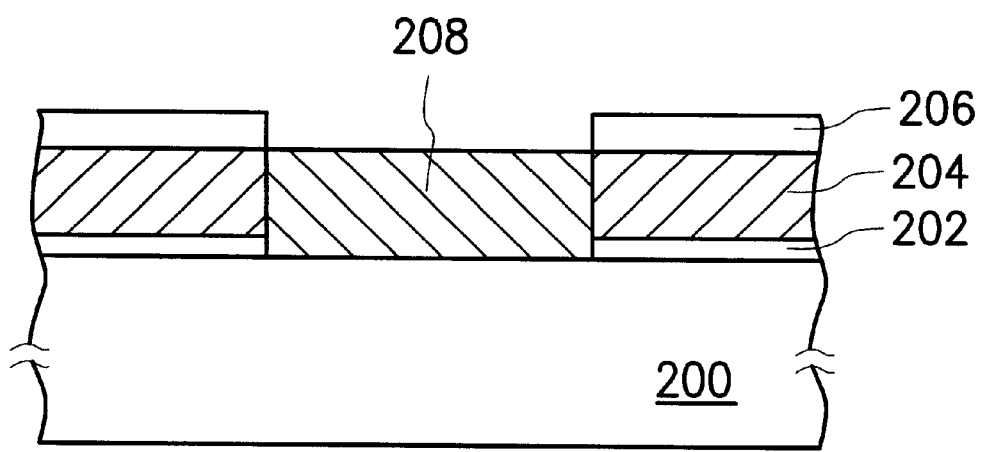

Referring to FIG. 2B, a selective epitaxial growth (SEG) step is performed to form an epitaxial layer 208 on the surface of substrate 200 inside the buried contact opening 207. Epitaxial layer 208 fills up buried contact opening 207; therefore, a surface of epitaxial layer 208 is level with a surface of first conducting layer 204. In general, there are two types of selective epitaxial growth: type I SEG and type II SEG. In type I SEG process, Si epitaxy only grows on the bare Si substrate surface, with no Si epitaxy deposited on the dielectric film (i.e. the masking layer 206). Type II SEG is a process that allows simultaneous deposition of Si epitaxy on different materials, but with different lattice, for example, deposition of polysilicon on the bare Si substrate surface and deposition of amorphous silicon on the surface of the oxide layer. The SEG step performed in this invention is type I SEG. Therefore, no epitaxy is formed on the masking layer 206 during the SEG step because masking layer 206 covers the whole region except buried contact opening 207.

Figure 2C:
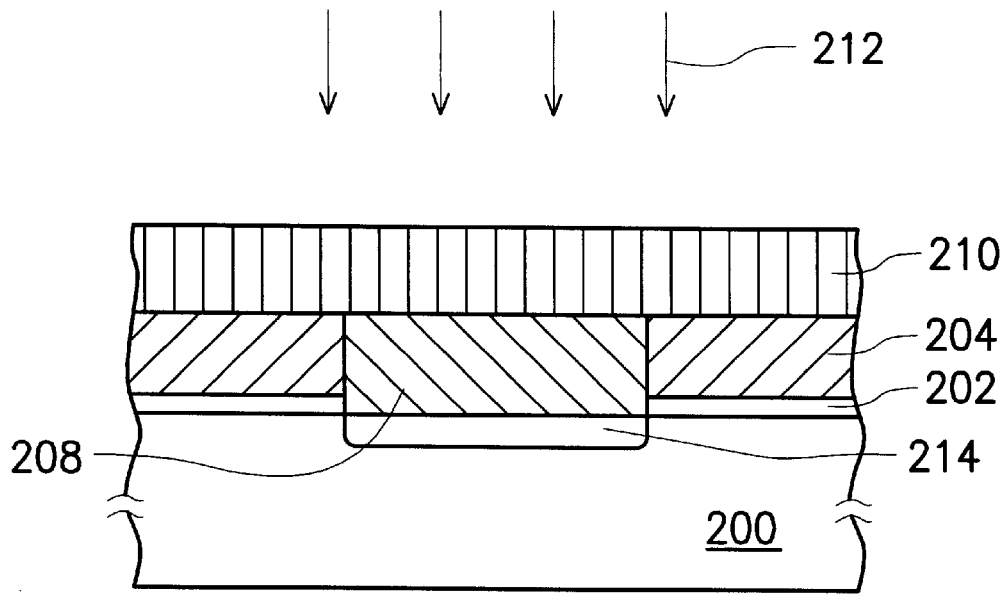

Referring to FIG. 2C, masking layer 206 is removed. Since epitaxial layer 208 fills up buried contact opening 207, the surface of epitaxial layer 208 is level with the surface of first conducting layer 204. A second conducting layer 210 is formed on the first conducting layer 204 and on the epitaxial layer 208. An ion implantation step 212 is performed to form a buried contact 214 in the substrate 200 that is under epitaxial layer 208. Gate oxide layer 202 covers the whole surface of substrate 200 except the region exposed by buried contact opening 207; therefore, gate oxide layer 202 prevents dopants from being ion implanted into any part of substrate 200 except the region exposed by buried contact opening 207.

Figure 2D:
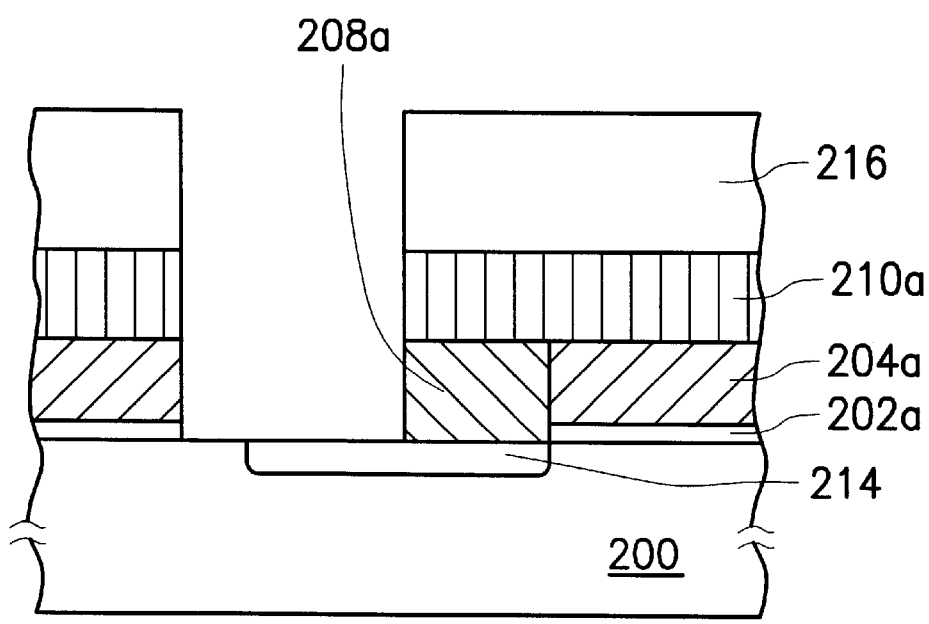

Referring to FIG. 2D, a patterned photoresist layer 216 is formed on the second conducting layer 210. Patterned photoresist layer 216 is used to define gate oxide layer 202, first conducting layer 204, epitaxial layer 208 and second conducting layer 210 of FIG. 2C to form gates. Patterned gate oxide layer 202a, patterned first conducting layer 204a, patterned epitaxial layer 208a and patterned second conducting layer 210a are formed thereon, and then parts of buried contact 214 and of the surface of substrate 200 are exposed, in which a source/drain 216 is to be formed The combined thickness for epitaxial layer 208 and second conducting layer 210 above buried contact 214 is the same as the combined thickness for gate oxide layer 202, first conducting layer 204 and second conducting layer 210. Because buried contact 214 is covered by more than one conducting layer, substrate 200 inside buried contact 214 is not over-etched to form a silicon trench during the defining process for gate oxide layer 202, first conducting layer 204 and second conducting layer 210.

Figure 2E:
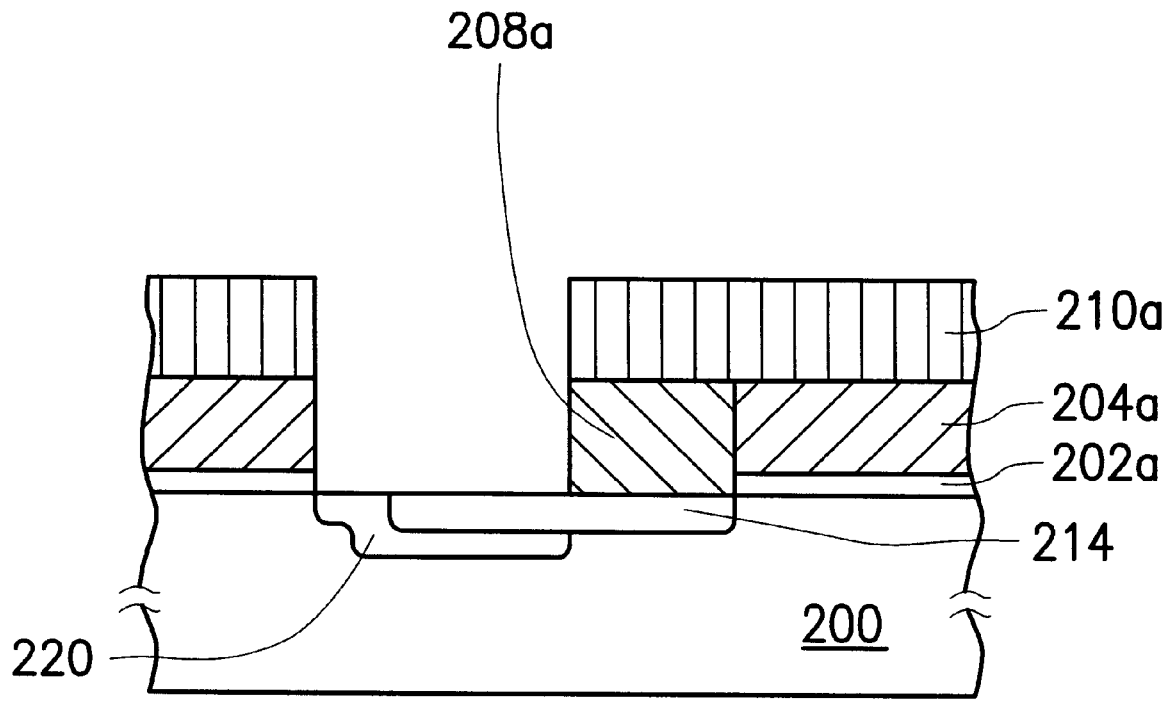

Referring to FIG. 2E, patterned photoresist layer 216 is removed. A source/drain 220 is formed in the substrate 200 while patterned gate oxide layer 202a, patterned first conducting layer 204a, patterned epitaxial layer 208a and patterned second conducting layer 210a are used as a mask. A part of source/drain 220 is mixed with a part of buried contact 214.

Because there is no height difference between the surfaces of the region that is above buried contact 214 and of the region that is above the non-buried contact region, no silicon trench that occurs in the prior art is formed. The problems caused by the silicon trench, for example, increased resistivity between the source/drain and the buried contact and current leakage, can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a buried contact in a SRAM, wherein a substrate is provided, the method comprising:

forming a gate oxide layer, a first conducting layer and a masking layer sequentially on the substrate, wherein the first conducting layer has a first surface;

forming a buried contact opening inside the gate oxide layer, the first conducting layer and the masking layer, wherein the buried contact opening exposes a part of the substrate;

forming an epitaxial layer on the surface of the substrate which is exposed by the buried contact opening, wherein the epitaxial layer fills up the buried contact opening and has a second surface;

removing the masking layer;

forming a second conducting layer above the substrate;

forming a buried contact in the substrate that is below the epitaxial layer;

patterning the gate oxide layer, the first conducting layer, the epitaxial layer and second conducting layer to expose a part of the substrate and a part of the buried contact; and forming a source/drain in the substrate with patterned gate oxide layer, patterned first conducting layer, patterned epitaxial layer and patterned second conducting layer serving as a mask, wherein a part of the source/drain is mixed with a part of the buried contact.

2. The method as claimed in claim 1, wherein the first surface of the first conducting layer is at the same level as the second surface of the epitaxial layer.

3. The method as claimed in claim 1, wherein a material of the masking layer comprises silicon oxide4.

4. The method as claimed in claim 1, wherein a material of the masking layer comprises silicon nitride.

5. A method of fabricating a buried contact in a SRAM, wherein a gate oxide layer, a first conducting layer, a masking layer and a buried contact opening are formed on a provided substrate, the method comprising:

forming an epitaxial layer in the buried contact opening by selective epitaxial growth, wherein the epitaxial layer fills up the buried contact opening and has a surface;

removing the masking layer;

forming a second conducting layer above the substrate;

forming a buried contact in the substrate that is below the epitaxial layer;

patterning the gate oxide layer, the first conducting layer, the epitaxial layer and second conducting layer to expose a part of the substrate and a part of the buried contact; and forming a source/drain in the substrate with patterned gate oxide layer, patterned first conducting layer, patterned epitaxial layer and patterned second conducting layer serving as a mask, wherein a part of the source/drain is mixed with a part of the buried contact.

6. The method as claimed in claim 5, wherein a surface of the first conducting layer is at the same level as the surface of the epitaxial layer.

7. The method as claimed in claim 5, wherein a material of the masking layer comprises silicon oxide.

8. The method as claimed in claim 5, wherein a material of the masking layer comprises silicon nitride.

* * * * *